(12) United States Patent
Marrs (10) Patent No.: US 8,383,520 B2
(45) Date of Patent: Feb. 26, 2013

(54) METHOD OF ETCHING ORGANOSILOXANE DIELECTRIC MATERIAL AND SEMICONDUCTOR DEVICE THEREOF

(75) Inventor: Michael Marrs, Phoenix, AZ (US)

(73) Assignee: Arizona Board of Regents, a body corporate of the State of Arizona, Acting for and on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 13/118,240

(22) Filed: May 27, 2011

(65) Prior Publication Data

US 2011/0230047 A1 Sep. 22, 2011

Related U.S. Application Data

(63) Continuation of application No. PCT/US2009/066114, filed on Nov. 30, 2009, and a continuation of application No. PCT/US2009/066111, filed on Nov. 30, 2009.

(60) Provisional application No. 61/119,303, filed on Dec. 2, 2008, provisional application No. 61/119,248, filed on Dec. 2, 2008.

(51) Int. Cl.
*H01L 21/302* (2006.01)

(52) U.S. Cl. .................................. 438/710; 438/725

(58) Field of Classification Search .................. None
See application file for complete search history.

(56) References Cited

U.S. PATENT DOCUMENTS

| | | | |
|---|---|---|---|
| 5,453,157 A | 9/1995 | Jeng | |
| 5,702,980 A | 12/1997 | Yu et al. | |
| 6,051,508 A | 4/2000 | Takase et al. | |
| 6,358,832 B1 | 3/2002 | Edelstein et al. | |
| 6,531,389 B1* | 3/2003 | Shue et al. | 438/637 |
| 6,541,398 B2 | 4/2003 | Grill et al. | |
| 6,632,746 B2* | 10/2003 | Kanegae et al. | 438/706 |
| 6,670,265 B2* | 12/2003 | Wang et al. | 438/624 |
| 6,746,969 B2 | 6/2004 | Shimada et al. | |
| 7,329,601 B2 | 2/2008 | Miyajima | |
| 7,344,993 B2 | 3/2008 | Balasubramaniam et al. | |
| 7,538,038 B2* | 5/2009 | Matsushita et al. | 438/710 |
| 2003/0201465 A1 | 10/2003 | Ryuzaki et al. | |
| 2005/0186801 A1 | 8/2005 | Uno et al. | |
| 2005/0221599 A1 | 10/2005 | Kanegae et al. | |
| 2005/0233583 A1* | 10/2005 | Miyajima | 438/672 |
| 2006/0019491 A1* | 1/2006 | Soda | 438/638 |
| 2008/0122121 A1 | 5/2008 | Suda et al. | |
| 2010/0140807 A1 | 6/2010 | Kobayashi et al. | |

OTHER PUBLICATIONS

International Search Report from PCT/US09/66111, 8 pages. Oct. 25, 2010.
International Search Report from PCT/US09/66114, 9 pages. Sep. 3, 2010.

* cited by examiner

*Primary Examiner* — Scott B Geyer
(74) *Attorney, Agent, or Firm* — Bryan Cave LLP (57) ABSTRACT

In some embodiments, a method of etching an organosiloxane dielectric material can include: (a) providing the organosiloxane dielectric material; (b) providing a patterned mask over the organosiloxane dielectric material; and (c) reactive ion etching the organosiloxane dielectric material. Other embodiments are disclosed in this application.

23 Claims, 11 Drawing Sheets

| Properties | Dielectric Material |
|---|---|
| Cure temperature | ~400°C (when deposited over low temperature polysilicon)<br>~ 350°C (when deposited over amorphous silicon (a-Si))<br>< 200°C (when deposited over a flexible substrate) |
| Film Thickness | 1.5 μm to 3.5 μm |
| Transmittance | > 95% |
| Planarization | > 95% |
| Resistance to plasma induced damage | Fluorine-based plasma (e.g., Sulfur hexaflourine ($SF_6$), carbon tetra fluorine ($CF_4$), trifluoromethane ($CHF_3$), $O_2$ plasma used for removing photoresist, and ashing |
| Adhesion | Aluminum (Al), chromium (Cr), indium tin oxide (ITO), silicon nitride (SiN), organic layers |
| Outgassing | Low (less than typical CVD chamber pressures) |
| Moisture uptake | Low moisture uptake |
| Dispense tool | Spin or slot die coaters, screen printers, spray coating |

TABLE 1: Properties of a First Example of a Dielectric Material

FIG. 10

| Properties | Dielectric Material |
|---|---|
| Film Thickness | 1 μm to 4 μm |
| Cure temperature | ~180°C |
| Etch Chemistry | Standard plasma etch chemistries |
| Etch Rate | >0.25 μm per minute |
| Feature Size | < 5 μm |
| Dielectric Constant (k) | < 4.0 |
| Breakdown Voltage | > 5 megavolts per centimeter (MV/cm) |
| Heat Resistance | ≥ 250°C |
| Adhesion | Al, ITO, molybdenum (Mo), photoresist |
| Moisture Uptake | <0.2 wt % over 2 hours |
| Planarization | > 95% |
| Outgassing | No |
| Transparency | >95% |

TABLE 2: Properties of a Second Example of a Dielectric Material

FIG. 11

GRAPH 1: An Illustration of Thickness of the First Dielectric Material Versus the Spin Rate (i.e., Speed) of the Semiconductor Material

*FIG. 12*

METHOD OF ETCHING ORGANOSILOXANE DIELECTRIC MATERIAL AND SEMICONDUCTOR DEVICE THEREOF

CROSS-REFERENCE TO RELATED APPLICATIONS

This application is a continuation of (a) PCT Application No. PCT/US2009/066114, filed Nov. 30, 2009, which claims the benefit of U.S. Provisional Application No. 61/119,303, filed Dec. 2, 2008, and (b) PCT Application No. PCT/US2009/066111, filed Nov. 30, 2009, which claims the benefit of U.S. Provisional Application No. 61/119,248, filed Dec. 2, 2008. PCT Application No. PCT/US2009/066114, PCT Application No. PCT/US2009/066111, U.S. Provisional Application No. 61/119,303, and U.S. Provisional Application No. 61/119,248 are incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license to others on reasonable terms as provided by the terms of Grant/Contract No. W911NF-04-2-0005 by the Army Research Lab (ARL).

FIELD OF THE INVENTION

This invention relates generally to semiconductor devices and methods of providing semiconductor devices, and relates, more particularly, to method of providing semiconductor devices with intralayer dielectrics, interlayer dielectrics, and etch chemistries of dielectric materials.

DESCRIPTION OF THE BACKGROUND

Manufacturers traditionally use silicon dioxide ($SiO_2$) or other dielectric materials with a dielectric constant of less than the dielectric constant (3.9) of silicon dioxide in microelectronic circuits to reduce capacitive coupling and, thereby, increase the speed of the semiconductor devices. These dielectric materials can contain organic groups attached to silicon (Si) in the silicon dioxide and are deposited by chemical vapor deposition. The dielectric material insulates adjacent metal lines and vias in the same layer (intralayer dielectric) or in two different layers (interlayer dielectric). Flat panel display manufactures have adopted dielectric materials and the corresponding technologies from microelectronic industries to build flat panel display screens.

Traditionally, the dielectric material used as intralayer dielectrics or interlayer dielectrics in flat panel displays is $SiN_x$ or silicon dioxide and is deposited by plasma enhanced chemical vapor deposition (PECVD). Manufactures chose these dielectric materials due to their good electrical performance. As the size of the flat panel display substrate increases, however, PECVD deposited traditional dielectric materials alone become too costly, and the PECVD cannot meet the manufacturers' requirements for planarization at the surface of the dielectric material.

Accordingly, a need or potential for benefit exists for a cost-effective method of forming interlayer dielectric and/or intralayer dielectric that provides suitable planarization.

BRIEF DESCRIPTION OF THE DRAWINGS

To facilitate further description of the embodiments, the following drawings are provided in which.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically or otherwise. Two or more electrical elements may be electrically coupled, but not mechanically or otherwise coupled; two or more mechanical elements may be mechanically coupled, but not electrically or otherwise coupled; two or more electrical elements may be mechanically coupled, but not electrically or otherwise coupled. Coupling (whether mechanical, electrical, or otherwise) may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

DETAILED DESCRIPTION OF EXAMPLES OF EMBODIMENTS

In a number of embodiments, a method of providing a semiconductor device can include: (a) providing a substrate; (b) depositing a first metal layer over the substrate; (c) spin-coating a first dielectric material over the first metal layer, where the first dielectric material includes an organic siloxane-based dielectric material; and (d) depositing a second dielectric material comprising silicon nitride over the first dielectric material.

In other embodiments, a method of providing a semiconductor device can include: (a) providing a substrate; (b) depositing a first dielectric material comprising silicon nitride over the substrate; (c) spin-coating a second dielectric material over the first dielectric material, where the second dielectric material includes an organosiloxane dielectric material; and (d) depositing a third dielectric material comprising silicon nitride over the second dielectric material.

In yet another embodiment, a method of providing a semiconductor device can include: (a) providing a substrate; (b) depositing a first dielectric material comprising silicon nitride over the substrate; (c) spin-coating a second dielectric material over the first dielectric material, (d) depositing a third dielectric material comprising silicon nitride over the second dielectric material; (e) providing one or more first semiconductor elements; (f) providing a first metal layer; (g) spin-coating a fourth dielectric material over the first metal layer; and (h) depositing a fifth dielectric material comprising silicon nitride layer over the fourth dielectric material. The second dielectric material and the fourth dielectric material can include the same organosiloxane dielectric material.

In further embodiments, a semiconductor device can include: (a) a substrate; (b) a first metal layer over the substrate; and (c) a first dielectric material the first metal layer. The first dielectric material can include an organic siloxane-based dielectric material.

In another embodiment, a semiconductor device can include: (a) a substrate; (b) a first dielectric material including silicon nitride over the substrate; (c) a second dielectric material over the first dielectric material, where the second dielectric material includes an organosiloxane dielectric material; and (c) a third dielectric material including silicon nitrate over the second dielectric material.

In still additional embodiments, a method of etching an organosiloxane dielectric material can include: (a) providing the organosiloxane dielectric material; (b) providing a patterned mask over the organosiloxane dielectric material; and (c) reactive ion etching the organosiloxane dielectric material.

In further embodiments, a method of etching an organic siloxane-based dielectric can include: (a) providing a metal layer; (b) providing the organic siloxane-based dielectric over the metal layer; (c) patterning a mask over the organic siloxane-based dielectric; and (d) etching the organic siloxane-based dielectric with a fluorine-based etchant with the metal layer acting as an etch stop layer.

In yet other embodiments, a method of etching a siloxane-based dielectric material can include: (a) providing the siloxane-based dielectric material; (b) apply a patterned photoresist over the siloxane-based dielectric material; (c) plasma etching the siloxane-based dielectric material; and (d) removing the patterned photoresist by ashing the patterned photoresist at a temperature below 110° C.

Figure 1:
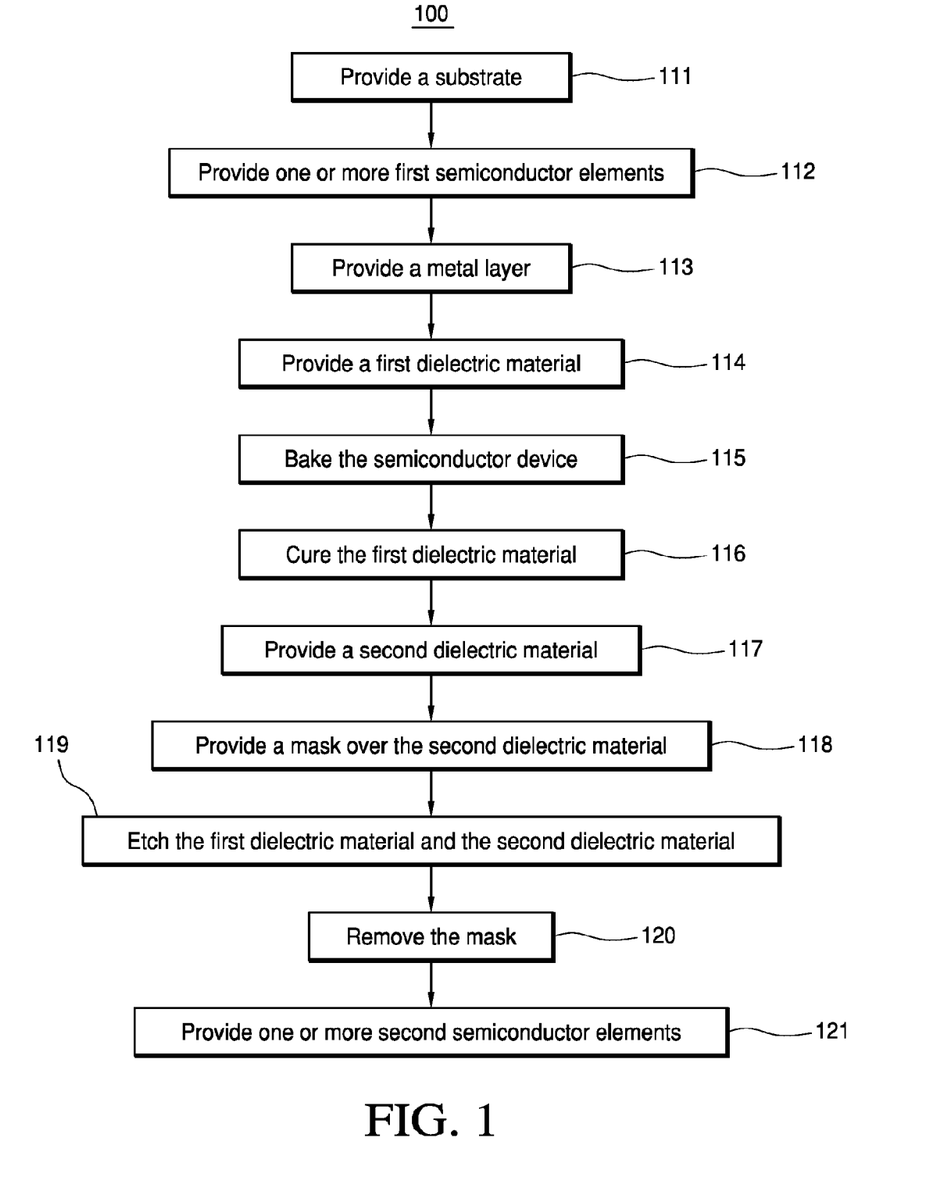
FIG. 1 illustrates an example of a method of providing a semiconductor device, according to a first embodiment.

Turning to the drawings, FIG. 1 illustrates an example of a method 100 of providing a semiconductor device, according to a first embodiment. In the same or different embodiments, method 100 can be considered a method of etching an organosiloxane dielectric material. Method 100 can also be considered a method of etching an organic siloxane-based dielectric or a method of etching a siloxane-based dielectric material. Method 100 is merely exemplary and is not limited to the embodiments presented herein. Method 100 can be employed in many different embodiments or examples not specifically depicted or described herein.

Figure 2:
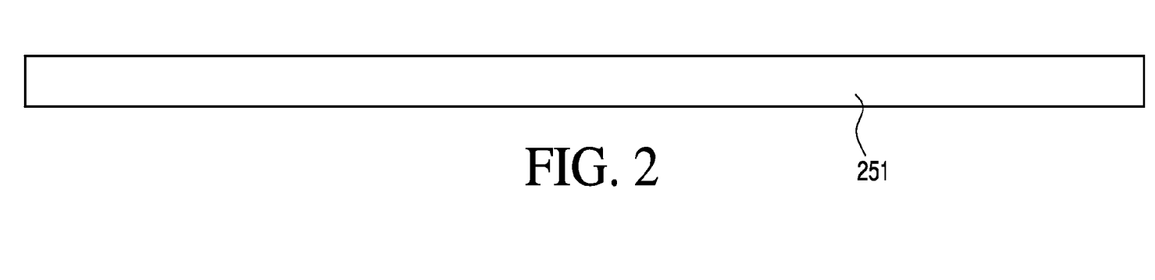
FIG. 2 illustrates a cross-sectional view of an example of a substrate, according to the first embodiment.

Method 100 includes a procedure 111 of providing a substrate. FIG. 2 illustrates a cross-sectional view of an example of substrate 251, according to the first embodiment. In some embodiments, procedure 111 of FIG. 1 can include providing a flexible substrate. In many examples, the flexible substrate is a plastic substrate. For example, flexible substrates can include polyethylene naphthalate (PEN), polyethylene terephthalate (PET), polyethersulfone (PES), polyimide, polycarbonate, cyclic olefin copolymer, or liquid crystal polymer.

The thickness of the plastic substrate can be in the range of approximately 25 micrometers to approximately 300 micrometers. In the same or different embodiments, the thickness of the plastic substrate can be in the range of approximately 100 micrometers to approximately 200 micrometers. In various embodiments, the flexible substrate can be a PEN substrate from Teijin DuPont Films of Tokyo, Japan, sold under the tradename planarized "Teonex® Q65."

In a different example, procedure 111 can include providing a stainless steel substrate. In still further examples, the substrate can include silicon, iron nickel (FeNi) alloys (e.g., FeNi, FeNi36, or Inver™; Inver™ comprises an alloy of iron (64%) and nickel (36%) (by weight) with some carbon and chromium), iron nickel cobalt (FeNiCo) alloys (e.g., Kovar™, Kovar™ typically comprises 29% nickel, 17% cobalt, 0.2% silicon, 0.3% manganese, and 53.5% iron (by weight)), titanium, tantalum, molybdenum, aluchrome, and/or aluminum.

In the same or different embodiments, the substrate can be coupled to a carrier to provide rigidity and to support the substrate. In various embodiments, the carrier includes at least one of the following: alumina ($Al_2O_3$), silicon, glass, steel, sapphire, barium borosilicate, soda lime silicate, alkalai silicates, or other materials. The carrier can be coupled to the substrate using an adhesive or by other means.

For example, the carrier could be sapphire with a thickness between approximately 0.7 millimeters (mm) and approximately 1.1 mm. The carrier could also include 96% alumina with a thickness between approximately 0.7 mm and approximately 1.1 mm. In a different embodiment, the thickness of the 96% alumina is approximately 2.0 mm. In another example, the carrier could be single crystal silicon with a thickness of at least approximately 0.65 mm. In still a further embodiment, the carrier substrate could be stainless steel with a thickness of at least approximately 0.5 mm. In some examples, the carrier is slightly larger than the substrate.

In some examples, the substrate is cleaned as part of procedure 111 of FIG. 1. In other examples, the substrate does not need to be cleaned because the substrate is already clean.

The substrate can be cleaned to remove any particles on the substrate. In some embodiments, the substrate can be cleaned to removal any adhesives on the substrate. For example, if the substrate is stainless steel, the substrate can be washed with hexanes for approximately twenty seconds while spinning at approximately 1,000 rpm (revolutions per minute). In some examples, the edge of the substrate is sprayed with hexanes for the last ten seconds. Afterwards, the substrate is spun at approximately 3,000 rpm for approximately twenty seconds to dry the substrate. In some examples, the substrate can be baked for approximately sixty seconds at approximately 105 degrees Celsius (° C.) to further dry the substrate.

To remove large particles on the substrate, the substrate can be scrubbed. For example, if the substrate is stainless steel, the substrate can be scrubbed with soap and water (e.g., 40 milliliters (mL) of Alconox Detergent 8 mixed with one liter of water) using a sponge. Alconox Detergent 8 is manufactured by Alconox, Inc. of White Plains, N.Y.

Organics can be removed from the substrate by ashing. For example, if the substrate is stainless steel, the substrate can be ashed for approximately ninety minutes in an oxygen ($O_2$) environment at a pressure of approximately 1200 milliTorr.

Figure 3:
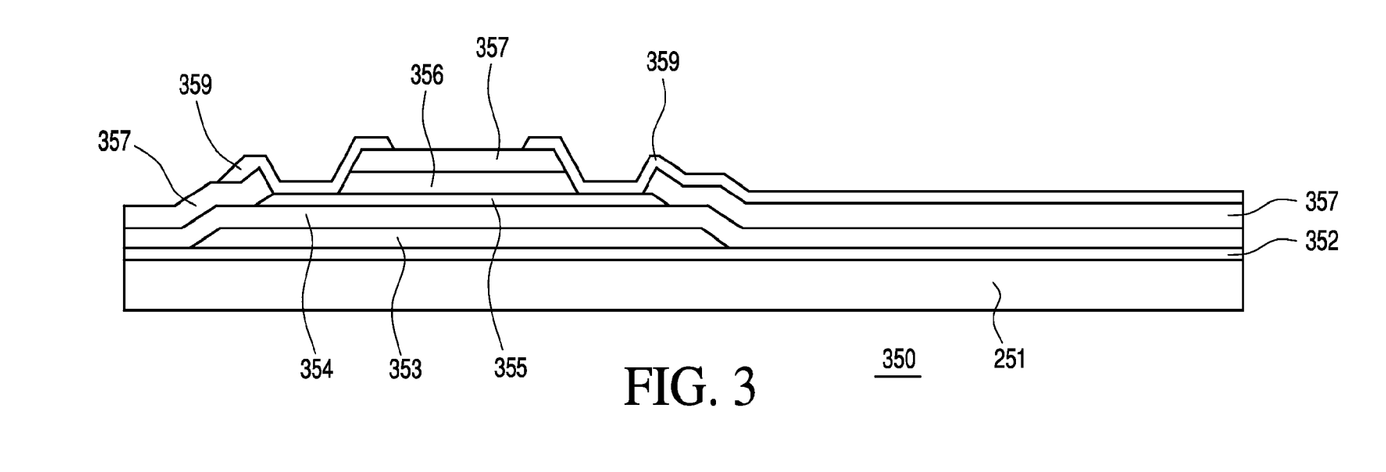
FIG. 3 illustrates a cross-sectional view of an example of a semiconductor device after providing one or more semiconductor elements, according to the first embodiment.

Subsequently, method 100 includes a procedure 112 of providing one or more first semiconductor elements. FIG. 3 illustrates a cross-sectional view of an example of semiconductor device 350 after providing one or more semiconductor elements, according to the first embodiment.

Referring to FIG. 3, for example, an approximately 0.30 micrometer (μm) thick silicon nitride passivation layer 352 is provided over substrate 251 and a patterned molybdenum gate 353 can be provided over silicon nitride passivation layer 352. An approximately 0.30 μm thick silicon nitride gate dielectric 354 can be formed over molybdenum gate 353 and silicon nitride passivation layer 352. A patterned approximately 0.08 μm thick amorphous silicon (a-Si) layer 355 can be provided over silicon nitride gate dielectric 354, and a patterned approximately 0.10 μm thick silicon nitride intermetal dielectric (IMD) layer 356 can be provided over a-Si layer 355. A patterned approximately 0.10 μm thick silicon nitride passivation layer 357 can be provided over silicon nitride IMD layer 356, a-Si layer 355, and silicon nitride gate dielectric 354. A patterned N+a-Si layer 359 can be provided over silicon nitride passivation layer 357.

Referring again to FIG. 1, method 100 continues with a procedure 113 of providing a metal layer. In some examples, the metal layer can be deposited over the substrate and then patterned etched. In some examples, the metal layer comprises an aluminum layer, and/or the metal layer is etched after patterning a photoresist layer over the metal layer.

Figure 4:
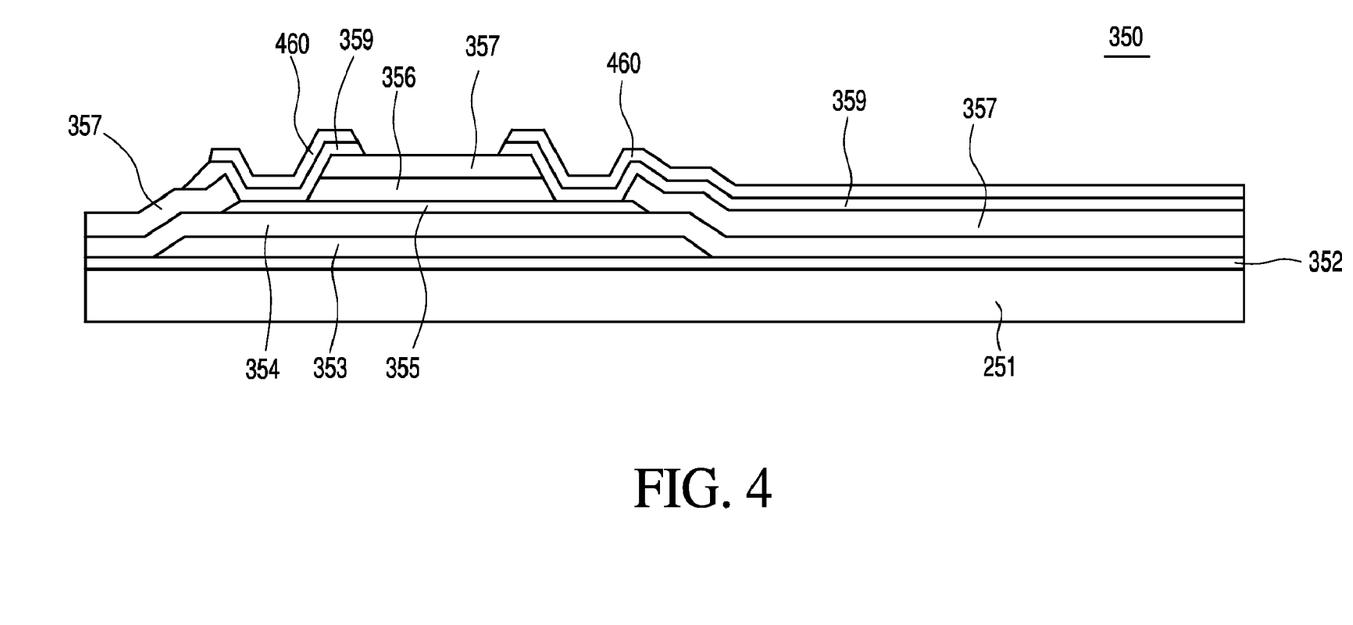
FIG. 4 illustrates a cross-sectional view of an example of the semiconductor device of FIG. 3 after providing a metal layer, according to the first embodiment.

FIG. 4 illustrates a cross-sectional view of an example of semiconductor device 350 after providing metal layer 460. In the example illustrated in FIG. 4, metal layer 460 is provided over substrate 251, silicon nitride passivation layer 352, molybdenum gate 353, silicon nitride gate dielectric 354, a-Si layer 355, silicon nitride IMD layer 356, silicon nitride passivation layer 357, and N+a-Si layer 359.

In some examples, metal layer 460 has a thickness of approximately 0.20 μm. After metal layer 460 is deposited, metal layer 460 can be patterned etched as shown in FIG. 4. In the same or different examples, metal layer 460, and N+a-Si layer 359 can be etched in one in-situ etching procedure with silicon nitride passivation layer 357 acting as an etch stop layer. In some examples, metal layer 460 can be etched using an AMAT 8330, manufactured by Applied Material, Inc. of Santa Clara, Calif.

Subsequently, method 100 includes a procedure 114 of providing a first dielectric material. The first dielectric material can be provided over the metal layer of procedure 113. In some examples, the first dielectric material can be an organic siloxane-based dielectric material, organosiloxane dielectric material, and/or siloxane-based dielectric material. In various embodiments, the first dielectric material can be organic. Using an organic siloxane-based dielectric material can allow for thicker films and more flexible films than with a non-organic siloxane-based dielectric material. In some examples, the first dielectric material can be used as an interlayer dielectric. In the other examples, the first dielectric material can be used as an intralayer dielectric.

Figure 10:
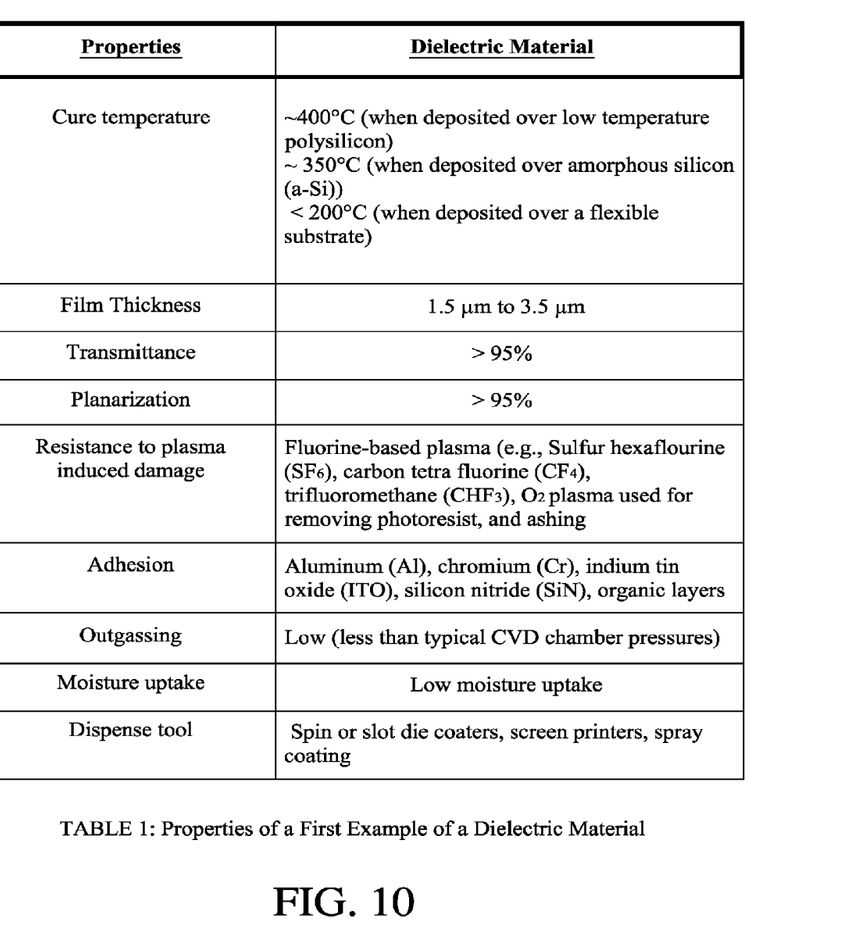
FIG. 10 illustrates Table 1 that includes properties of a first example of a dielectric material that can be used as the first dielectric material in procedure of FIG. 1, according to an embodiment.

Table 1 in FIG. 10 illustrates properties of a first example of a dielectric material that can be used as the first dielectric material in procedure 114, according to an embodiment.

As used in Table 1, film thickness refers to the desired thickness of the dielectric material that displays the other properties in the table. Transmittance refers to the percentage of light that is transmitted through the dielectric material. Planarization refers to the degree of planarization (DOP) of the dielectric material. Resistance to plasma induced damage indicates the plasmas that will not damage this film. Adhesion means the dielectric material can be coupled to at least these other materials. Outgassing can refer to outgassing pressure of the dielectric material or the rate at which the dielectric material outgases. Moisture uptake can refer to the rate at which moisture is released from the dielectric material. Dispense tools refers to equipment that can be used to apply the dielectric material.

Figure 11:
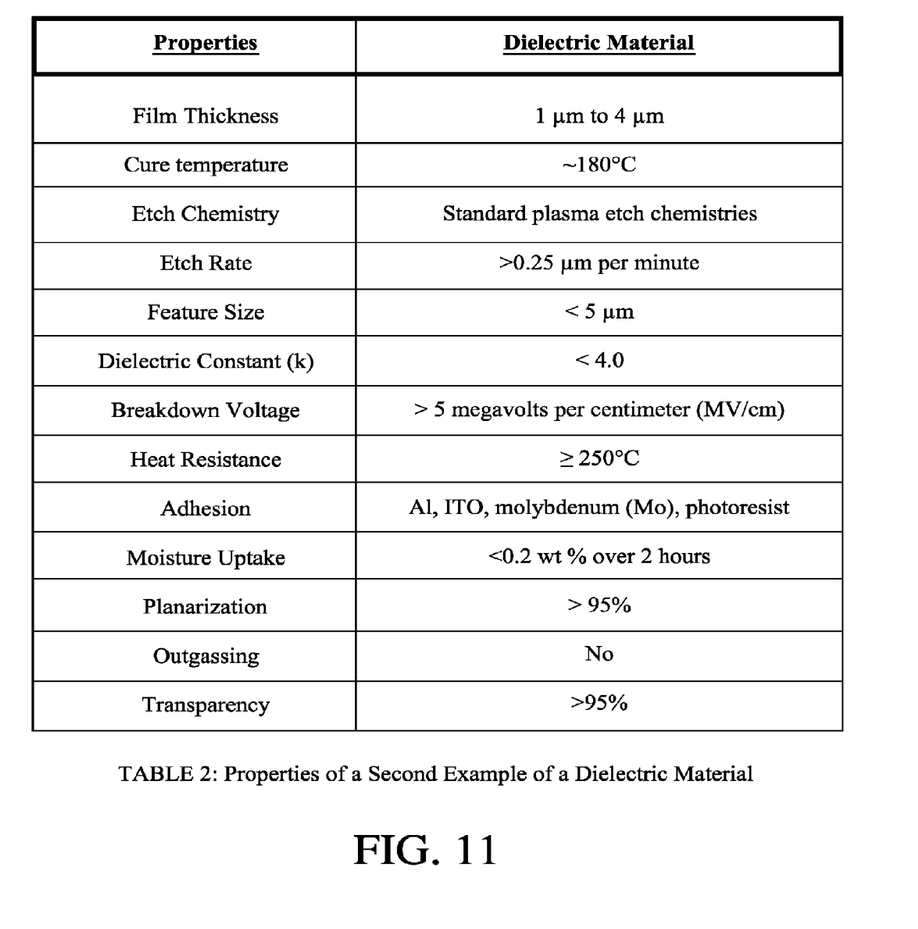
FIG. 11 illustrates Table 2 that includes properties of a second example of a dielectric material that can be used as the first dielectric material in procedure of FIG. 1, according to an embodiment.

Table 2 in FIG. 11 illustrates properties of a second example of a dielectric material that can be used as the first dielectric material in procedure 114, according to an embodiment.

As used in Table 2, etch chemistries refers to etch chemistries that can be used to etch the dielectric material. Etch rate is the minimum etch rate of the dielectric material when using the etch chemistries. Feature size refers to the smallest size of an element or feature formed with the dielectric material. Breakdown voltage is the voltage per length at which the dielectric material begins acting as a conductor. Heat resistance is the lowest temperature that the material can withstand before becoming unstable.

Figure 5:
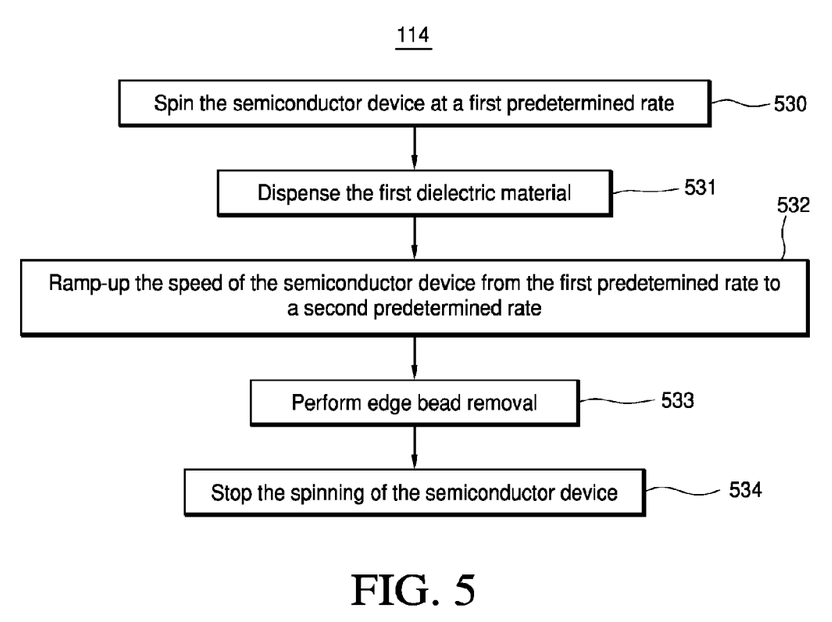
FIG. 5 illustrates an example of a procedure of providing a first dielectric material, according to the first embodiment.

FIG. 5 illustrates an example of procedure 114 of providing a first dielectric material. In various embodiments, the first dielectric material can be a spin-on-dielectric. Accordingly, in these examples, the dielectric can be applied to the semiconductor device by spin-coating the first dielectric material over the first metal layer and various silicon nitride layers. In various embodiments, the application of the first dielectric material can be performed in a Rite Track 8600 available from Rite Track, Inc., of West Chester, Ohio.

Referring to FIG. 5, procedure 114 can include a process 530 of spinning the semiconductor device at a first predetermined rate. In some examples, the first predetermined spin rate is between approximately 500 revolutions per minute (rpm) and approximately 2000 rpm. In same or different embodiment, the first predetermined rate is approximately 1000 rpm.

Subsequently, procedure 114 can include a process 531 of dispensing the first dielectric material. In some examples, the first dielectric material is dispensed over the substrate while the substrate is spinning at the first predetermined rate. In some examples, the first dielectric material can be dispensed using a syringe. If the substrate is a six inch diameter wafer, approximately 4 milliliters (mL) can be dispensed over the semiconductor device. In some examples, the pressure in the tip of the syringe during dispensing can be approximately 15 kilopascals (kPa). In the same or different embodiment, after the syringe dispenses the first dielectric material, the syringe has suck back pressure of approximately 1 kPa. The suck back pressure of the syringe prevents dripping additional amounts of the first dielectric material from the syringe after the dispensing process is complete. For a 6-in wafer, the dispensing process takes approximately 3 seconds. The semiconductor device is spun at the first predetermined rate until process 531 is complete.

In various embodiments, a dynamic dispensing process is used. That is, the substrate is spinning while the first dielectric material is dispensed. In some examples, the first dielectric material is dispensed at the center of the substrate. In other examples, at the beginning of the dispensing process, the syringe is located over the center of the substrate and moves from the center of the substrate to the edge of the substrate at a constant rate of approximately thirty to approximately sixty millimeters per second while the substrate is spinning In other embodiments, a static dispensing process is used. That is, the substrate is not spun during the dispensing process.

Figure 12:
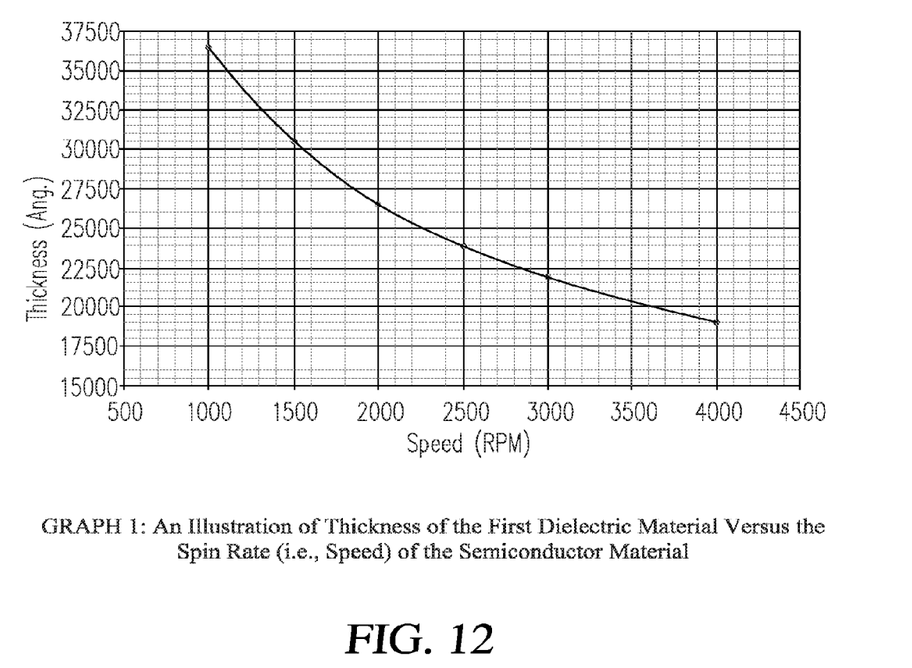
FIG. 12 illustrates Graph 1 that includes an illustration of thickness of the first dielectric material versus the spin rate (i.e., speed) of the semiconductor material, according to an embodiment.

Next, procedure 114 includes a process 532 of ramping-up the speed of the semiconductor device from the first predetermined rate to a second predetermined rate. In some examples, the second predetermined spin rate is between approximately 2000 rpm and approximately 4000 rpm. In the same or different embodiment, the second predetermined rate is approximately 2600 rpm. Spinning the semiconductor device at the second predetermined rate of approximately 2600 rpm for approximately thirty seconds can distribute the first dielectric material with a thickness of approximately two micrometers over the surface of the semiconductor device. Different thicknesses of the first dielectric material can be achieved by using different second predetermined rates. Graph 1 in FIG. 12 is an illustration of thickness of the first dielectric material versus the spin rate (i.e., speed) of the semiconductor material, according to an embodiment.

Procedure 114 can further include a process 533 of performing edge bead removal. In some examples, during processes 531 and 532, the first dielectric material flows outward due to the centrifugal force toward the edge of the substrate and creates a ridge (i.e., the edge bead) on the top side edge of the semiconductor device. The edge bead, when dried, could flake off and increase defects of the semiconductor device and/or damage the manufacturing equipment. Accordingly, the edge bead is removed in process 533. In some examples, the equipment used in processes 531 and 532 can include an edge bead removal device. In some examples, a solvent is sprayed on the edge bead to remove the first dielectric material around the edge of the substrate. In some examples, while the semiconductor device is spun at a third predetermined rate, a solvent is sprayed over, for example, the approximately five to approximately six millimeters inside the edge of the substrate. In some examples, removing the first dielectric material from the edges of the substrate also helps to ensure that when a second dielectric material is provided over the first dielectric material (procedure 117 of FIG. 1), the edges of the first dielectric material is capped by a second dielectric material.

In some examples, cyclohexanone, propylene glycol monomethyl ether acetate (PGMEA), or other edge bead removing solvents can be used. In some examples, the semiconductor device is rotated at a third predetermined rate of approximately 1000 rpm during the edge bead removal process. In some examples, the semiconductor device is spun at the third predetermined rate for approximately thirty seconds and solvent is sprayed on the bead edge during this time.

Subsequently, procedure 114 continues with a process 534 of stopping the spinning of the semiconductor device. After the spinning of the semiconductor device is stopped, procedure 114 is complete.

Referring back to FIG. 1, method 100 includes a procedure 115 of baking the semiconductor device. In some examples, baking the semiconductor device includes baking the first dielectric material of procedure 114, the first metal layer of procedure 113, the one or more semiconductor elements of procedure 112, and the substrate of procedure 111. One of the purposes of the bake is cause evaporation of the solvents from the edge bad process. Baking the semiconductor device can also increase planarization, decrease film defects, and cross-link the first dielectric material.

In various embodiments, the baking of the semiconductor device is performed using a two bake sequence. The baking process can be performed at atmospheric pressure using a hot plate. Procedure 115 can be performed, for example, in a Rite Track 8800, manufactured by Rite Track of West Chester, Ohio.

The first bake is a bake for approximately sixty seconds at approximately 160° C. In an alternative example, the first bake can be an approximately sixty second bake at approximately 150° C. After the first bake is complete, in some examples, the semiconductor device is allowed to cool for approximately thirty seconds before the second bake. The semiconductor device can be allowed to cool at room temperature (and not using a chill plate). The semiconductor device is allowed to cool, in these examples, because the handling system uses polytetrafluoroethylene (e.g., Teflon® material from E. I. du Pont de Nemours and Company of Wilmington, Del.) coated chucks to handle the semiconductor device. Placing a hot semiconductor device on the polytetrafluoroethylene coated chuck can damage the chuck. If other equipment is used, the cooling process can possibly be skipped.

After letting the semiconductor device cool, the semiconductor device can be baked for a second time on a hot plate. In some embodiments, the second bake can be for approximately sixty seconds at a temperature greater than approximately 160° C. because 160° C. is the boiling point of PGMEA. For example, if the first bake was at the 160° C., second bake can be for approximately sixty seconds at approximately 170° C. If the first bake was at the 150° C., second bake can be for approximately sixty seconds at approximately 200° C. After the second bake is complete, the semiconductor device can be cooled again for thirty seconds. In other embodiments, other sequences of bakes can be performed.

After the baking is complete, the next procedure in method 100 is a procedure 116 of curing the first dielectric material. Curing of the first dielectric material can improve the cross-linking of the first dielectric material. In some examples, the curing can be performed in a convection oven in a nitrogen atmosphere at atmospheric pressure (i.e., approximately one atmosphere).

In various examples, the semiconductor device can be placed in the oven. Afterwards, the temperature in the oven can be ramped-up to approximately 200° C., and the semiconductor device can be baked for approximately one hour at approximately 200° C. The temperature is ramped-up a rate of approximately 1-2° C. per minute to minimize outgassing of the first dielectric material of procedure 114. After the bake is complete, the temperature is slowly ramped down (e.g., 1-2° C. per minute) to room temperature.

In another embodiment, a baking procedure with five separate bakes can be used. The first bake can be a bake at approximately 60° C. for approximately ten minutes. The ramp-up time to approximately 60° C. from room temperature to 60° C. is approximately ten minutes. After baking at approximately 60° C., the temperature is ramped-up over approximately thirty-two minutes to approximately 160° C. The semiconductor device is baked for approximately thirty-five minutes at approximately 160° C.

The temperature of the convection oven is then increased to approximately 180° C. over approximately ten minutes after the 160° C. bake. The semiconductor device is baked for approximately twenty minutes at approximately 180° C.

After baking at 180° C., the temperature is ramped-up over approximately fifty minutes to approximately 200° C. The semiconductor device is baked for approximately sixty minutes at approximately 200° C. Finally, in this bake procedure, the temperature in the oven is ramped-down to approximately 60° C. over approximately seventy minutes. The semiconductor device is baked for approximately ten minutes at approximately 60° C. After baking is complete, the semiconductor device is allowed to cool to approximately room temperature before proceeding with method 100 of FIG. 1.

Subsequently, method 100 includes a procedure 117 of provide a second dielectric material. In some examples, providing the second dielectric material can include depositing the second dielectric material over the organosiloxane dielectric layer (i.e., the first dielectric material of procedure 114). In some examples, the second dielectric material can comprise silicon nitride. In the same or different examples, the second dielectric material can include silicon oxynitride ($SiO_xN_y$) and/or silicon dioxide ($SiO_2$). In some examples, a low temperature plasma-enhanced chemical vapor deposition (PECVD) process can be used to deposit the second dielectric material. In some examples, as part of providing the second dielectric material, the first dielectric material is capped by the second dielectric material. In some examples, the edges of the first dielectric material can be capped by the second dielectric material so the first dielectric material is not exposed to any subsequent oxygen ($O_2$) plasma ashings. Oxygen plasma ashings can degrade the first dielectric material in some examples.

The second dielectric material can be deposited with a thickness of approximately 0.1 μm to approximately 0.2 μm. The second dielectric material can be deposited to protect the second dielectric material from later etches.

The next procedure in method 100 is a procedure 118 of providing a mask over the second dielectric material. The mask applied in procedure 118 can be an etch mask for an etching process of procedure 119 of FIG. 1.

In some examples, procedure 118 can include applying a patterned photoresist over the siloxane-based dielectric layer (i.e., the first dielectric material of procedure 114) or patterning a mask over the organic siloxane-based dielectric (i.e., the first dielectric material of procedure 114). Similarly, procedure 118 can include providing a patterned mask over the organosiloxane dielectric layer (i.e., the first dielectric material of procedure 114).

In some examples, the mask covers one or more portions of the first dielectric material and the second dielectric material that are not to be etched. The mask can be provided with a thickness such that the mask is not etched through during the etching process of procedure 119 of FIG. 1. In some examples, the mask can have a thickness of approximately 3.5 μm or approximately 2.5 μm to approximately 5.0 μm.

In some examples, the mask comprises photoresist. In some examples, the photoresist can be AZ Electronic Materials MiR 900 Photoresist, manufactured by AZ Materials of Luxembourg, Luxembourg. In some examples, the photoresist is coated over the second dielectric material using the Rite Track 8800. For example, the semiconductor device can be vapor primed and spin-coated with the mask (e.g., the photoresist). After coating the semiconductor device, the semiconductor device is baked at approximately 105° C. for approximately sixty seconds.

Next, the semiconductor device is aligned to the correct position with a template and exposed to UV (ultraviolet) light to transfer the mask image from the template to the mask. After exposing the mask, the semiconductor device is baked for approximately ninety seconds at approximately 110° C. The mask is then developed using an approximately ninety second puddle with standard development chemicals to remove the portions of the photoresist that were not exposed to the UV light.

After the development is completed, the last portion of providing the mask over the second dielectric material is performing a photoresist reflow process on the mask. Photoresist reflow is the process of heating the mask after the photoresist has been developed to cause the photoresist to become at least semi-liquid and flow.

In some examples, the semiconductor device is baked at approximately 140° C. for approximately sixty seconds. This photoresist reflow process will decrease the sharpness of the edges of the mask, and thus, when etched in procedure 119 of FIG. 1, the vias in the first dielectric and the second dielectric will have sloped sides. In some examples, the sloped sizes are at an angle of approximately thirty degrees from horizontal.

Next, method 100 includes a procedure 119 of etching the first dielectric material and the second dielectric material. The first dielectric material and the second dielectric material are etched to create vias in the first dielectric material and the second dielectric material.

In some examples, the first dielectric material and the second dielectric material are etched in the same procedure using the same etch mask. In other examples, the first dielectric material is etched in a first procedure, and the second dielectric is etched in a second procedure. In these other examples, a mask can be applied to the first dielectric material; the first dielectric material can be etched; and the mask can be removed before the second dielectric material is provided in procedure 118 of FIG. 1. Then, a mask can be applied to the second dielectric material, and the second dielectric material can be etched. In another example, the second dielectric material can be etched using the mask of procedure 118; the mask can be removed; and the patterned second dielectric material can be used as the mask for patterning the first dielectric material.

In many embodiments, the first dielectric material and the second dielectric material are plasma etched. In the same of different embodiments, the first dielectric material and the second dielectric material are reactive ion etched (RIE). In some examples, the first dielectric material and the second dielectric material are etched with a fluorine-based etchant. In some examples, the etchant can be trifluoromethane ($CHF_3$), sulfur hexafluoride ($SF_6$), or other fluorine-based etchants.

In some examples, the first material can be the organosiloxane dielectric material described previously, and the second material can be silicon nitride. In these examples, the first dielectric material and the second dielectric material can be RIE etched with sulfur hexafluoride ($SF_6$) for approximately four minutes. If sulfur hexafluoride is used as the etchant, the etching can be performed in a plasma chamber with a 1:2 ratio of sulfur hexafluoride to oxygen ($O_2$).

The etch rate of the sulfur hexafluoride for the first dielectric material and the second dielectric material are approximately the same (i.e., approximately 0.5 µm per minute). The etch rate of the second dielectric material, however, is marginally greater than the first dielectric material. In some example, the pressure in the plasma chamber during etching is approximately 50 milliTorr to approximately 400 milliTorr. The RIE etch can be performed in a Tegal 901, manufactured by Tegal Corporation of Petaluma, Calif.

The second dielectric material can be etched before the first dielectric material. In many examples, the metal layer underneath the second dielectric material functions as an etch stop for the etching process. If sulfur hexafluoride is used as the etchant, the metal layer can be aluminum. In this embodiment, the metal layer cannot be molybdenum or tantalum because sulfur hexafluoride etches these two metals. In a different embodiment, the metal layer can include molybdenum and/or tantalum if the etch for the overlying second dielectric layer is a timed etch.

Figure 6:
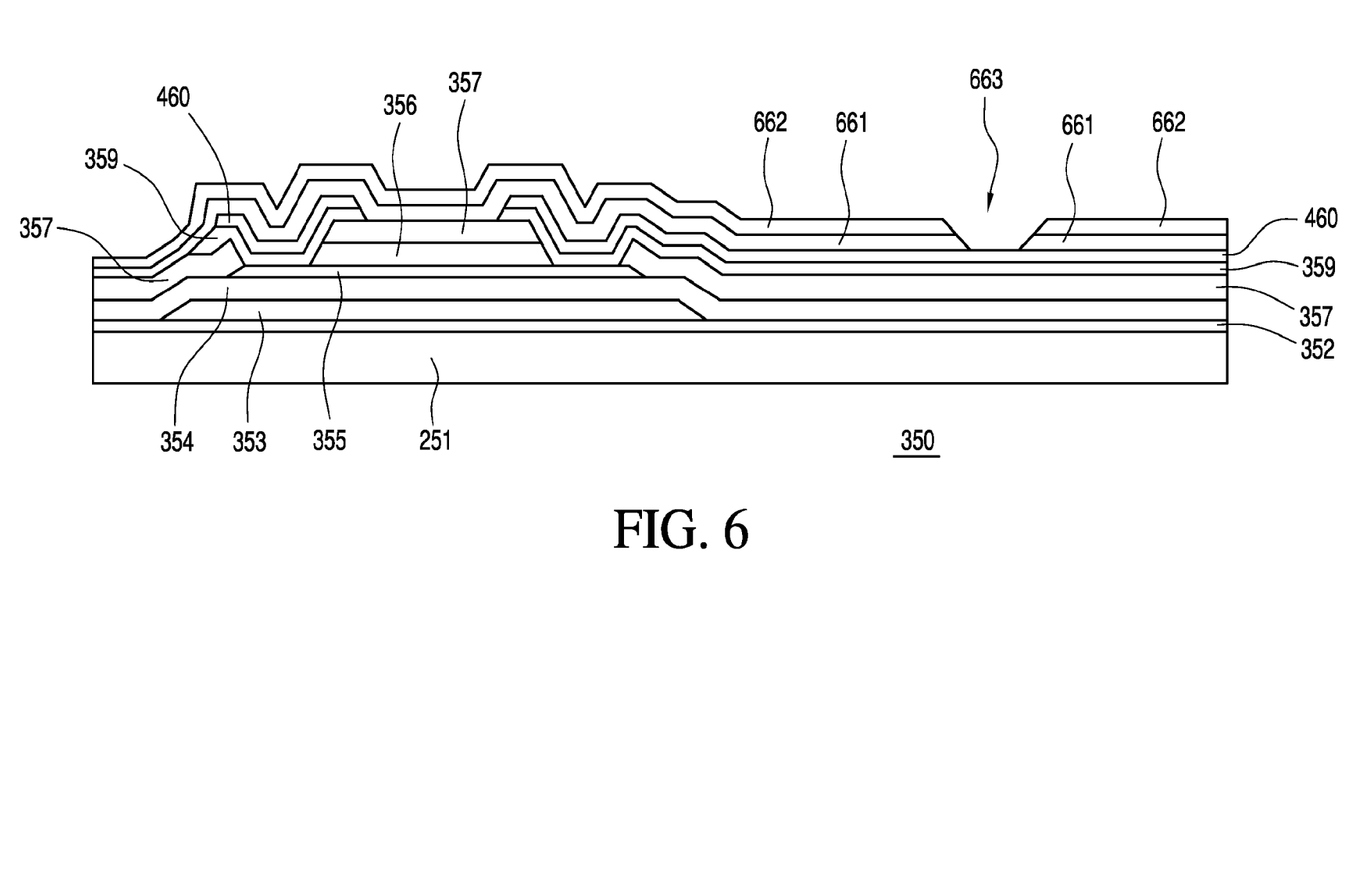
FIG. 6 illustrates an example of the semiconductor device of FIG. 3 after etching etch a first dielectric material and a second dielectric material, according to the first embodiment.

A buffered oxide etch (BOE) and chlorine based etchants cannot be used in some examples because they do not etch the first dielectric material when it comprises an organosiloxane dielectric material. FIG. 6 illustrates an example of semiconductor device 350 after etching etch first dielectric material 661 and second dielectric material 662. After procedure 119 in FIG. 1, semiconductor device 350 can include vias 663, as shown in FIG. 6. The mask over second dielectric layer 662 is not shown in FIG. 6.

Referring again to FIG. 1, the next procedure in method 100 is a procedure 120 of removing the mask. In some examples, the mask is removed by ashing the mask (e.g., the photoresist) at a temperature below 110° C. If the mask is ashed at a temperature above 110° C., cracking can occur in the first dielectric material. Accordingly, in some examples, ashing of the mask is performed at a temperature in the range of approximately 70° C. to approximately 90° C. In the same or different example, the ashing of the mask is performed at a temperature in the range of approximately 77° C. to approximately 84° C.

The ashing can be performed at a pressure of no greater than approximately 300 milliTorr. Oxygen ($O_2$) can flow through in the chamber during the ashing process at a rate of approximately 50 sccm (standard cubic centimeters per minute). In various examples, the ashing procedure can be performed in a Tegal 901. After ashing the mask, the semiconductor device can be rinsed with deionized water and spin dried. In some examples, the rinsing can be performed in a quick dump rinser, and the drying can be performed in a spin rinse dryer.

In other examples, a wet strip can be used to remove the photoresist. In some embodiments, an N-methyl pyrolidinone (NMP) based stripper can be used.

Figure 7:
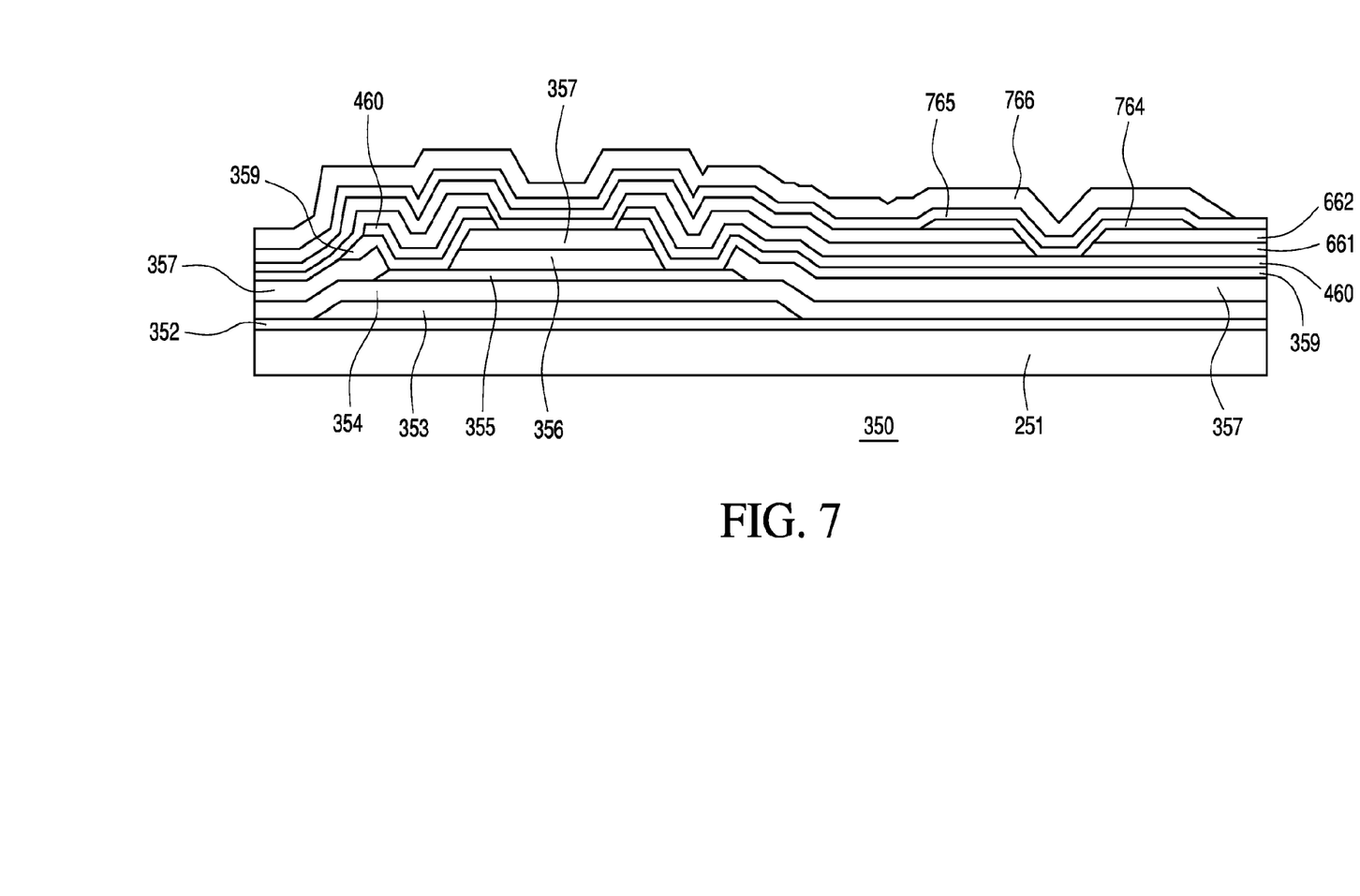
FIG. 7 illustrates an example of the semiconductor device of FIG. 3 after providing one or more second semiconductor elements, according to the first embodiment.

The next procedure in method 100 of FIG. 1 is a procedure 121 of providing one or more second semiconductor elements. FIG. 7 illustrates an example of semiconductor device 350 after providing one or more second semiconductor elements. As illustrated in FIG. 7, in some examples, procedure 121 of FIG. 1 can include a procedure of depositing a second metal layer 764 over second dielectric material 662 and at least partially in vias 663 (FIG. 6). Second metal layer 764 can be a patterned 0.15 µm molybdenum layer.

An approximately 0.05 µm thick indium tin oxide (ITO) layer 765 can be deposited over second metal layer 764. In some examples, second metal layer 764 and ITO layer 765 can be patterned in a single process. An approximately 0.10 µm thick layer of patterned silicon nitride 766 can be provided over ITO layer 765.

Figure 8:
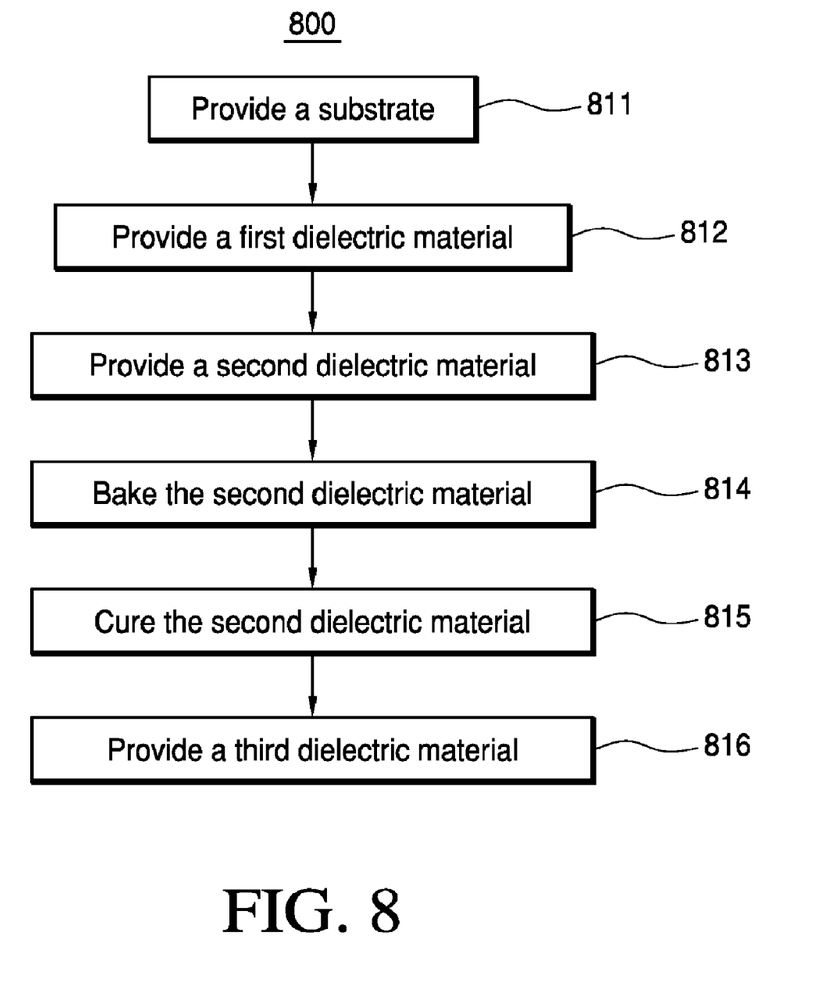
FIG. 8 illustrates an example of a method of providing a semiconductor device, according to a second embodiment.

Turning to another embodiment, FIG. 8 illustrates an example of a method 800 of providing a semiconductor device, according to a second embodiment. In the same or different embodiments, method 800 can be considered a method of etching an organosiloxane dielectric material. Method 800 can also be considered a method of etching an organic siloxane-based dielectric or a method of etching a siloxane-based dielectric material. Method 800 can also be considered a method of planarizing a substrate. Method 800 is preferably applied to a substrate (e.g., stainless steel) that requires planarization, and not applied to substrates (e.g., plastic substrates) that do not require planarization. Method 800 is merely exemplary and is not limited to the embodiments presented herein. Method 800 can be employed in many different embodiments or examples not specifically depicted or described herein.

Referring to FIG. 8, method 800 includes a procedure 811 of providing a substrate. Procedure 811 can be similar or identical to procedure 111 of FIG. 1. The substrate can be similar or identical to substrate 251 of FIG. 2.

Method 800 can continue with a procedure 812 of providing a first dielectric material. In some examples, the first dielectric material can be similar or identical to second dielectric material 662 of FIG. 6 and procedure 117 of FIG. 1. For example, second dielectric material 662 can comprise a silicon nitride layer with a thickness of approximately 0.1 µm to approximately 0.2 µm.

The next procedure in method 800 is a procedure 813 of providing a second dielectric material. The second dielectric material can be similar or identical to the first dielectric material 661 of FIG. 6. Procedure 813 can be similar or identical to procedure 114 of FIG. 1.

Method 800 continues with a procedure 814 of baking the second dielectric material. In some examples, procedure 814 can be similar or identical to procedure 115 of FIG. 1.

Subsequently, method 800 includes a procedure 815 of curing the second dielectric material. In some examples, procedure 815 can be similar or identical to procedure 116 of FIG. 1.

In other examples, a different baking procedure with five separate bakes in a convection oven can be used. The first bake can be a bake at approximately 40° C. for approximately ten minutes. The ramp-up time from room temperature to approximately 40° C. is approximately two minutes. After baking at 40° C., the temperature is ramped-up over approximately thirty-two minutes to approximately 160° C. The semiconductor device is baked for approximately thirty-five minutes at approximately 160° C.

The temperature of the convection oven is then increased to approximately 180° C. over approximately ten minutes after the 160° C. bake. The semiconductor device is baked for approximately twenty minutes at approximately 180° C.

After baking at 180° C., the temperature is ramped-up over approximately fifty minutes to approximately 230° C. Alternatively, the temperature is ramped-up at approximately 2° C. per minute to approximately 230° C. The semiconductor device is baked for approximately fifteen hours at approximately 230° C.

Finally, in this bake procedure, the temperature in the oven is ramped-down to approximately 60° C. over approximately eighty-five minutes. The semiconductor device is baked for approximately ten minutes at approximately 60° C. After baking is complete, the semiconductor device is allowed to cool to approximately room temperature before proceeding with method 800 of FIG. 8.

Method 800 continues with a procedure 816 of providing a third dielectric material. In some examples, the third dielectric material can be deposited with a thickness of approximately 0.2 μm to approximately 0.4 μm. In some examples, the third dielectric material can be an approximately 0.3 μm thick layer of silicon nitride. After depositing the third dielectric material, the semiconductor device can be in-situ baked for approximately five minutes at approximately 180° C. In some examples, the third dielectric material can be similar or identical to nitride passivation layer 352 of FIG. 3.

Figure 9:
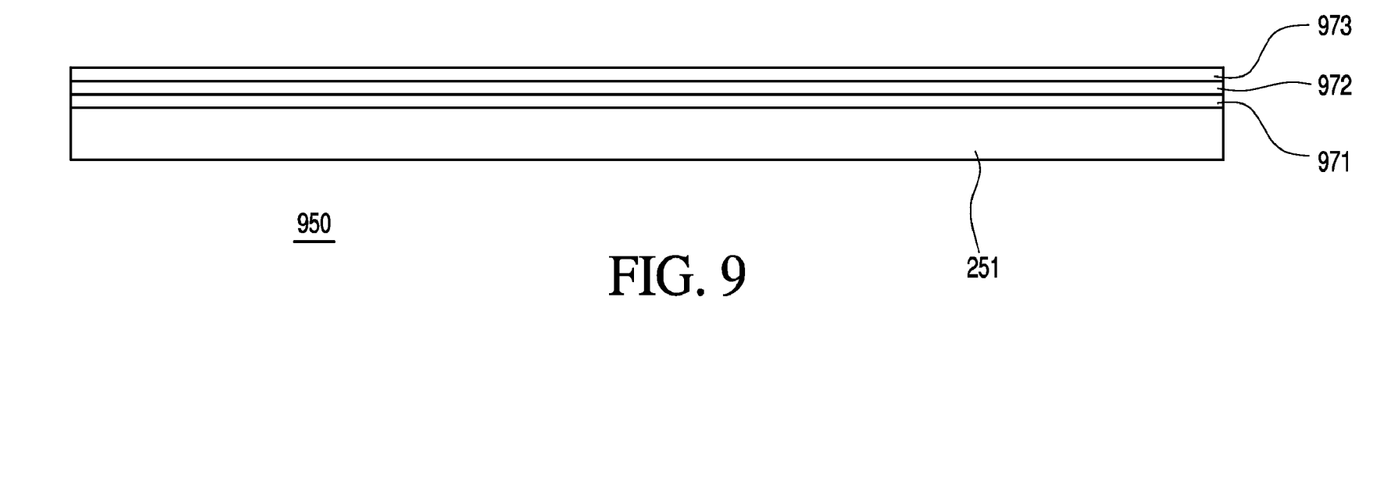
FIG. 9 illustrates an example of a semiconductor device according to the method of FIG. 8, according to the second embodiment.

FIG. 9 illustrates an example of a semiconductor device 950 after providing the third dielectric material, according to the second embodiment. In these examples, first dielectric material 971 is provided over substrate 251. Second dielectric material 972 is provided over first dielectric material 971 and third dielectric material 973 is provided over second dielectric material 972.

After providing the third dielectric layer, method 800 is identical to method 100 of FIG. 1. That is, the next procedure in method 800 is providing one or more first semiconductor elements (i.e., procedure 112 of FIG. 1), providing a metal layer (i.e., procedure 113 of FIG. 1), etc. In other examples, one or more procedures other than the procedures described in relation to FIG. 1 can be performed after procedure 816 of FIG. 8.

Although the invention has been described with reference to specific embodiments, it will be understood by those skilled in the art that various changes may be made without departing from the spirit or scope of the invention. For example, a third dielectric material can be provided before providing the first dielectric material in procedure 114 of FIG. 1. In some examples, the thickness of the third dielectric material can be approximately 0.1 μm to approximately 0.2 μm. The third dielectric can be silicon nitride in some examples. In the same or different embodiments, the third dielectric material can be the same as the second dielectric material 662 of FIG. 6 in some embodiments. In these examples, the first dielectric material is located between and protected by the second and third dielectric materials. Additional examples of such changes have been given in the foregoing description. Accordingly, the disclosure of embodiments is intended to be illustrative of the scope of the invention and is not intended to be limiting. It is intended that the scope of the invention shall be limited only to the extent required by the appended claims. To one of ordinary skill in the art, it will be readily apparent that the semiconductor device and method of providing the semiconductor device discussed herein may be implemented in a variety of embodiments, and that the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of etching an organosiloxane dielectric material, the method comprising:
   providing the organosiloxane dielectric material;
   providing a patterned mask over the organosiloxane dielectric material;
   reactive ion etching the organosiloxane dielectric material; and
   removing the patterned mask after reactive ion etching the organosiloxane dielectric material by ashing the patterned mask;
   wherein:
   removing the patterned mask after reactive ion etching the organosiloxane dielectric material by ashing the patterned mask is performed at a temperature in the range of approximately 70° C. to approximately 90° C.

2. The method of claim 1 further comprising:
   using a metal layer as an etch stop for the reactive ion etching of the organosiloxane dielectric material, wherein providing the organosiloxane dielectric material comprises providing the organosiloxane dielectric material over the metal layer.

3. The method of claim 2 wherein:
   the metal layer comprises at least one of aluminum, molybdenum, or tantalum.

4. The method of claim 1 wherein:
   reactive ion etching the organosiloxane dielectric material comprises etching the organosiloxane dielectric material with a fluorine-based etchant.

5. The method of claim 4 wherein:
   the reactive ion etching of the organosiloxane dielectric material is performed in a plasma chamber with a 1:2 ratio of sulfur hexafluoride to oxygen in the plasma chamber.

6. The method of claim 1 wherein:
   providing the patterned mask comprises:
      providing the patterned mask with a thickness such that the mask is not etched through during the reactive ion etching of the organosiloxane dielectric material.

7. The method of claim 1 wherein:
   providing the patterned mask comprises:
      providing the patterned mask with a thickness of approximately 0.25 micrometers to approximately 4.5 micrometers.

8. The method of claim 1 further comprising:
depositing a first dielectric layer over the organosiloxane dielectric material before reactive ion etching the organosiloxane dielectric material.

9. The method of claim 8, further comprising:
reactive ion etching the first dielectric layer before reactive ion etching the organosiloxane dielectric material.

10. The method of claim 9, wherein:
reactive ion etching of the first dielectric layer occurs in a plasma chamber; and
reactive ion etching the organosiloxane dielectric material occurs in the plasma chamber.

11. The method of claim 1, wherein:
reactive ion etching the organosiloxane dielectric material is performed at one or both of (a) an etch rate of approximately 0.5 micrometers per minute or (b) a pressure of approximately 50 milliTorr to approximately 400 milliTorr.

12. A method of etching an organic siloxane-based dielectric, the method comprising:
providing a metal layer;
providing the organic siloxane-based dielectric over the metal layer;
patterning a mask over the organic siloxane-based dielectric; and
etching the organic siloxane-based dielectric with a fluorine-based etchant with the metal layer acting as an etch stop layer;
wherein at least one of:
etching the organic siloxane-based dielectric comprises plasma etching the organic siloxane-based dielectric with the fluorine-based etchant with the metal layer acting as the etch stop layer;
etching the organic siloxane-based dielectric comprises reactive ion etching the organic siloxane-based dielectric with trifluoromethane;
or
etching the organic siloxane-based dielectric comprises reactive ion etching the organic siloxane-based dielectric with sulfur hexafluoride;
and
wherein providing the metal layer comprises at least one of:
depositing aluminum, the metal layer comprising the aluminum; or
keeping molybdenum and tantalum out of the metal layer.

13. The method of claim 12, wherein:
removing the mask over the organic siloxane-based dielectric by ashing the mask at a temperature below 110° C.

14. The method of claim 12, further comprising:
before patterning the mask over the siloxane-based dielectric material, providing an other dielectric material over the organic siloxane-based dielectric material.

15. The method of claim 14, wherein:
patterning the mask over the siloxane-based dielectric material comprises patterning the mask over the other dielectric material; and
etching the organic siloxane-based dielectric material comprises etching the other dielectric material with the fluorine-based etchant.

16. The method of claim 15, wherein:
after etching the organic siloxane-based dielectric material, removing the mask by ashing the mask at a temperature below 110° C.

17. The method of claim 15, wherein:
after etching the organic siloxane-based dielectric material, removing the mask by applying a wet strip to the mask.

18. The method of claim 17, wherein:
removing the mask by applying the wet strip to the mask comprises:
removing the mask by applying an N-methyl pyrolidinone based stripper to the mask.

19. A method of etching a siloxane-based dielectric material, the method comprising:
providing the siloxane-based dielectric material;
applying a patterned photoresist over the siloxane-based dielectric material;
plasma etching the siloxane-based dielectric material; and
removing the patterned photoresist by ashing the patterned photoresist at a temperature below 110° C.;
wherein one or both of:
removing the patterned photoresist by ashing the patterned photoresist is performed at a pressure of no greater than approximately 300 milliTorr; or
the temperature is greater than or equal to approximately 77° C. and less than or equal to approximately 84° C.

20. The method of claim 19, wherein:
applying the patterned photoresist comprises:
reflowing the patterned photoresist.

21. The method of claim 19, further comprising:
providing a metal layer;
wherein:
providing the metal layer comprises keeping molybdenum and tantalum out of the metal layer.

22. The method of claim 19, wherein:
plasma etching the siloxane-based dielectric material comprises:
plasma etching the siloxane-based dielectric material with sulfur hexafluoride.

23. The method of claim 19, wherein:
plasma etching the siloxane-based dielectric material comprises:
plasma etching the siloxane-based dielectric material with the metal layer acting as an etch stop layer.

* * * * *